United States Patent
Cuica

(10) Patent No.: US 11,402,411 B2
(45) Date of Patent: Aug. 2, 2022

(54) SWITCHING ARRANGEMENT AND METHOD FOR MONITORING AC SIGNALS

(71) Applicant: Eaton Intelligent Power Limited, Dublin (IE)

(72) Inventor: Horea Cuica, Lohmar (DE)

(73) Assignee: Eaton Intelligent Power Limited, Dublin (IE)

( * ) Notice: Subject to any disclaimer, the term of this patent is extended or adjusted under 35 U.S.C. 154(b) by 166 days.

(21) Appl. No.: 16/631,845

(22) PCT Filed: Jul. 6, 2018

(86) PCT No.: PCT/EP2018/068381
§ 371 (c)(1),
(2) Date: Mar. 4, 2020

(87) PCT Pub. No.: WO2019/015998
PCT Pub. Date: Jan. 24, 2019

(65) Prior Publication Data
US 2020/0191838 A1    Jun. 18, 2020

(30) Foreign Application Priority Data
Jul. 21, 2017 (DE) .................... 10 2017 116 534.7

(51) Int. Cl.
*G01R 19/18* (2006.01)
*G01R 19/04* (2006.01)
(Continued)

(52) U.S. Cl.
CPC .......... *G01R 19/04* (2013.01); *G01R 19/2513* (2013.01); *G05B 19/05* (2013.01); *H02M 1/14* (2013.01); *H02M 7/155* (2013.01)

(58) Field of Classification Search
CPC .. G01R 19/04; G01R 19/2513; G01R 19/175; G01R 19/16566; G01R 31/40;
(Continued)

(56) References Cited

U.S. PATENT DOCUMENTS 5,299,149 A    3/1994 Morita et al.
6,072,317 A *  6/2000 Mackenzie ........ G01R 31/3277
                                                  324/508
(Continued)

FOREIGN PATENT DOCUMENTS

GB          1254975 A    11/1971

*Primary Examiner* — Thang X Le
(74) *Attorney, Agent, or Firm* — Leydig, Voit & Mayer, Ltd.

(57) ABSTRACT

A switching arrangement for monitoring AC signals includes: one or a plurality of comparators, to which an AC signal to be monitored or a signal obtained therefrom is feedable in each case at a first comparison input, for comparison with a defined amplitude threshold value present at a second comparison input, so as to generate a first output signal at an output; a zero crossing detector, to which a reference signal or a signal obtained therefrom is feedable at a monitoring input, so as to generate a second output signal at an output of the zero crossing detector; a first timing element downstream of the zero crossing detector configured to generate a first clock signal as a function of the second output signal; and a second timing element downstream of the zero crossing detector configured to generate a second clock signal as a function of the second output signal.

9 Claims, 6 Drawing Sheets

(51) Int. Cl.
*G01R 19/25* (2006.01)
*G05B 19/05* (2006.01)
*H02M 1/14* (2006.01)
*H02M 7/155* (2006.01)

(58) Field of Classification Search
CPC ......... G01R 31/42; G05B 19/05; H02M 1/14; H02M 7/155
See application file for complete search history.

(56) References Cited

U.S. PATENT DOCUMENTS

| | | | |
|---|---|---|---|
| 6,255,864 B1 * | 7/2001 | Culca | H02H 3/24 327/78 |
| 2005/0151567 A1 * | 7/2005 | Shimada | G01R 19/16538 327/78 |
| 2009/0184718 A1 * | 7/2009 | Ivan | G01R 31/006 324/522 |
| 2011/0080197 A1 * | 4/2011 | Fan | H03L 7/16 702/77 |
| 2012/0086411 A1 * | 4/2012 | Takacs | H02M 1/4225 323/205 |
| 2013/0069627 A1 * | 3/2013 | Cs | G01R 19/2513 324/76.77 |
| 2013/0201731 A1 * | 8/2013 | Gu | H02M 1/12 327/551 |

\* cited by examiner

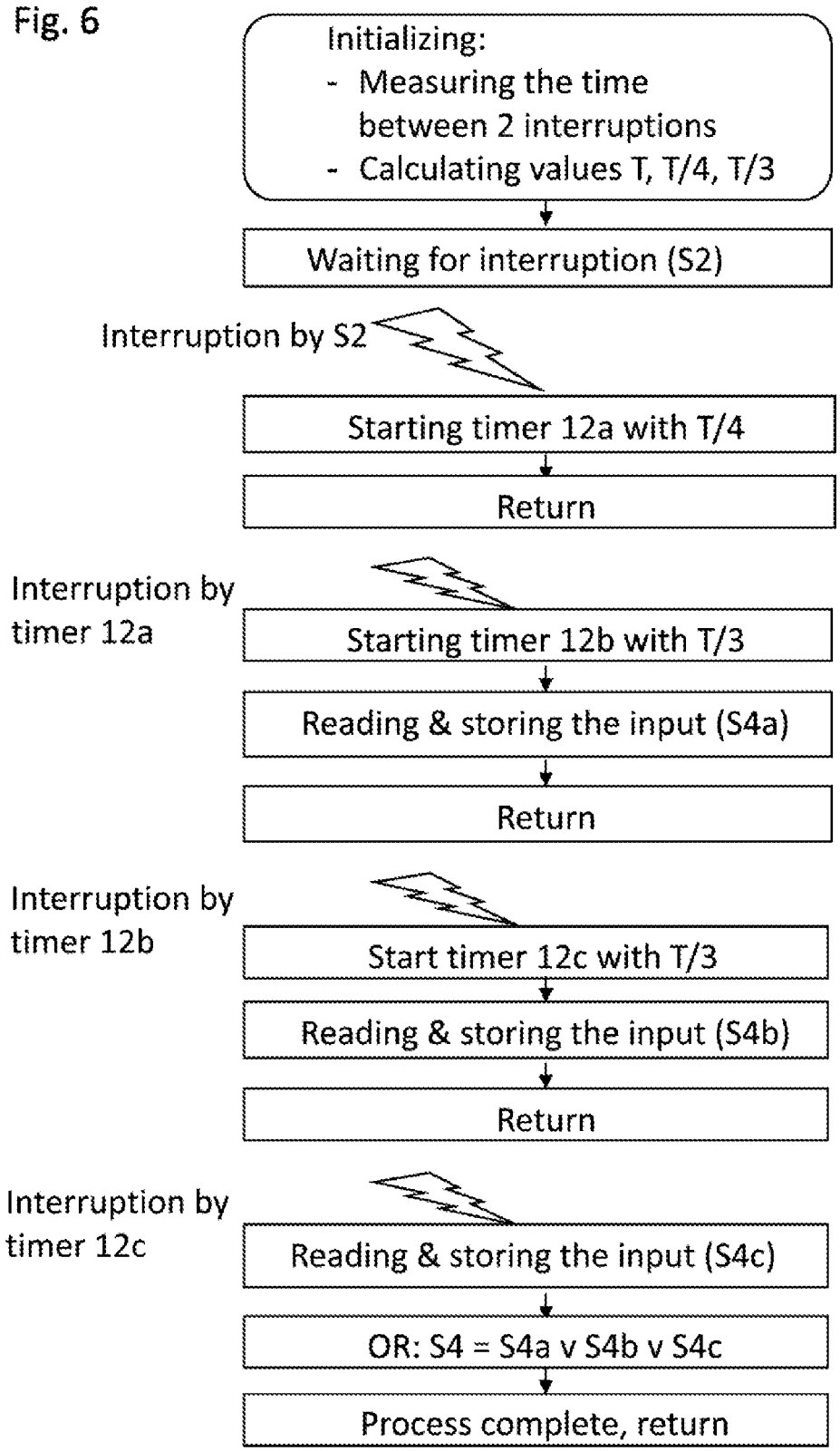

SWITCHING ARRANGEMENT AND METHOD FOR MONITORING AC SIGNALS

CROSS-REFERENCE TO PRIOR APPLICATIONS

This application is a U.S. National Phase application under 35 U.S.C. § 371 of International Application No. PCT/EP2018/068381, filed on Jul. 6, 2018, and claims benefit to German Patent Application No. DE 10 2017 116 534.7, filed on Jul. 21, 2017. The International Application was published in German on Jan. 24, 2019 as WO/2019/015998 under PCT Article 21(2).

FIELD

The present invention relates to a switching arrangement and to a method for monitoring AC signals, in particular AC input signals of electronic control devices, such as programmable logic controllers (PLC) or logic relays, or AC input signals or voltages from similar devices, and to a corresponding software product.

BACKGROUND

Small programmable controllers, such as, for example, PLC or programmable logic relays, generally offer variants which are supplied with alternating voltage (usually wide range 85 to 264 VAC) and have corresponding AC inputs. A differentiation or detection of a specific limit or threshold value is indispensable for the recognition of AC input signals for such controllers. Accurate and rapid detection of this defined threshold value is particularly advantageous for different applications.

A conventional method of providing the AC input signals to a processing microcontroller as logic signals is to rectify and smooth (filter) the AC signal to produce a quasi-DC signal. A logic signal is then generated from this quasi-DC signal by corresponding division and comparison. However, the quasi-DC signal still has a certain ripple (residual ripple). This stated ripple is a compromise between the quality of the DC signal (the smoother the better and more unproblematic the comparison) and the speed. This is because the better the filtering, for example with a capacitance that is all the greater, the slower this capacitance will discharge if the signal is switched off at the input. More elaborate circuits can optimize the result.

EP 0935758 B1 discloses a switching arrangement and a method which eliminate the disadvantages of this conventional solution by not filtering AC input signals, but rather merely converting them into corresponding pulses. In this case, a zero crossing signal is generated from the supply voltage of the device and a digitized input is read after a delay of one quarter of the period duration (90° or π/2 phase angle), i.e. at the peak of the supply voltage. The illustrated method assumes that the input signals are derived from the same phase (L1 or L2 or L3) as the supply voltage of the device. Thus, only the monitoring of one phase is possible by means of this method.

In practice, however, it is necessary to monitor AC input signals which originate not only from one phase, in particular the same phase, as the supply voltage, but from a plurality, preferably all three phases of a supply network.

SUMMARY

In an embodiment, the present invention provides a switching arrangement for monitoring AC signals, comprising: one or a plurality of comparators, to which an AC signal to be monitored or a signal obtained therefrom is feedable in each case at a first comparison input, for comparison with a defined amplitude threshold value present at a second comparison input, so as to generate a first output signal at an output; a zero crossing detector, to which a reference signal or a signal obtained therefrom is feedable at a monitoring input, so as to generate a second output signal at an output of the zero crossing detector; a first timing element downstream of the zero crossing detector configured to generate a first clock signal as a function of the second output signal; a second timing element downstream of the zero crossing detector configured to generate a second clock signal as a function of the second output signal or as a function of the first clock signal, the second clock signal differing from the first clock signal; a first edge-triggered flip-flop; and a second edge-triggered flip-flop, wherein the output of the comparator or the outputs of the comparators are connected to a level-triggered input of the first flip-flop and the second flip-flop, respectively, and wherein an output of the first timing element is connected to an edge-triggered input of the first flip-flop and an output of the second timing element is connected to an edge-triggered input of the second flip-flop so as to generate a first status signal at an output of the first flip-flop and a second status signal at an output of the second flip-flop.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 6: a schematic flow diagram of a software-controlled processing of input signals.

DETAILED DESCRIPTION

Figure 1A:
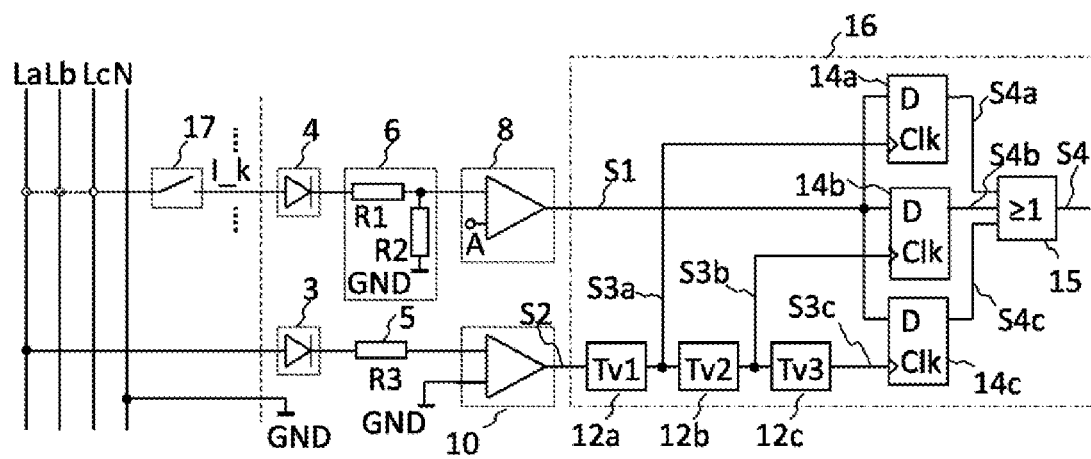
FIGS. 1A and 1B: Embodiments of a switching arrangement.

In an embodiment, the present invention provides a switching arrangement and a method of the type mentioned at the outset which enable the monitoring of AC input signals from a plurality of phases and nevertheless have a high processing speed and are simple to implement.

In an embodiment, the present invention provides a switching arrangement for monitoring AC signals.

The switching arrangement has one or a plurality of comparators, to which an AC signal to be monitored or a signal obtained therefrom can be fed in each case at a first comparison input, for comparison with a defined amplitude threshold value present at a second comparison input, so that a first output signal can be generated at an output. The AC signal to be monitored can either be fed directly into the comparator or comparators or preprocessed beforehand, so that a signal obtained therefrom can be fed to the comparator or comparators. A corresponding preprocessing can comprise rectifying by a rectifier (e.g. for half-wave rectification) or stepping down by a step-down converter. The AC signal to be monitored can be, for example, a voltage signal of a phase of a three-phase supply network.

The switching arrangement also has a zero crossing detector to which a reference signal or a signal obtained therefrom can be fed at a monitoring input, so that a second output signal can be generated at an output of the zero crossing detector. The reference signal may be, for example, a supply voltage of an electronic device (e.g., PLC, logic relay or similar device) in which the switching arrangement explained here is applied. The reference signal can either be fed directly into the zero crossing detector or preprocessed beforehand, so that a signal obtained therefrom can be fed to the zero crossing detector. A corresponding preprocessing can comprise rectification by a rectifier (advantageously half-wave rectification) analogous to the above-mentioned measures. Optionally, the preprocessing may additionally comprise a current limit by a resistor or a step-down by a step-down converter.

The switching arrangement further comprises a first timing element downstream of the zero crossing detector for generating a first clock signal as a function of the second output signal, and a second timing element downstream of the zero crossing detector for generating a second clock signal as a function of the second output signal or as a function of the first clock signal. The second clock signal differs from the first clock signal.

The switching arrangement further comprises a first edge-triggered flip-flop and a second edge-triggered flip-flop. The output of the comparator or the outputs of the comparators are connected to a level-triggered input of the first flip-flop and the second flip-flop, respectively. An output of the first timing element is connected to an edge-triggered input of the first flip-flop.

An output of the second timing element is connected to an edge-triggered input of the second flip-flop. In this way, a first status signal can be generated at an output of the first flip-flop and a second status signal can be generated at an output of the second flip-flop.

The AC signal is thus monitored relative to the defined amplitude threshold. The defined amplitude threshold may be predetermined and constant.

The switching arrangement of the described type thus makes it possible in a simple manner to monitor various AC input signals which are phase-shifted relative to one another, i.e. can originate from different phases of a supply network. The switching arrangement is configured to monitor various AC input signals relative to the amplitude threshold. For example, a first AC input signal, which is at the same frequency as and in phase with the reference signal, can be monitored and a second AC input signal, which is phase-shifted with respect to the first AC input signal and the reference signal, respectively, can be monitored.

The AC signal can thus be realized as an AC input signal.

By configuring two timing elements generating different clock signals and two flip-flops controlled by the different clock signals, amplitude values of at least two time-shifted AC input signals relative to the defined amplitude threshold can be monitored. Nevertheless, the switching arrangement is simple to implement and allows a high processing speed.

In various embodiments of the switching arrangement, the first timing element is configured to be triggered by the second output signal to generate the first clock signal. Thus, the second output signal triggers the first clock signal.

In various embodiments of the switching arrangement, the second timing element is downstream of the first timing element and is configured to be triggered by the first clock signal in order to generate the second clock signal. Thus, the first clock signal triggers the second clock signal.

A combination of these embodiments thus provides that the second output signal triggers the first clock signal and the first clock signal in turn triggers the second clock signal. In this way, the first and the second clock signal are triggered as a function of the second output signal, which in turn is obtained from the reference signal. Thus, the reference signal serves as a reference for the generation of the first and second clock signals.

In various embodiments, the switching arrangement also has a third timing element downstream of the zero crossing detector for generating a third clock signal as a function of the second output signal or as a function of the first clock signal or as a function of the second clock signal. The third clock signal differs from the first clock signal and from the second clock signal. In these embodiments, the switching arrangement also has a third edge-triggered flip-flop. The output of the comparator or the outputs of the comparators are connected to a level-triggered input of the third flip-flop. An output of the third timing element is connected to an edge-triggered input of the third flip-flop such that a third status signal can be generated at an output of the third flip-flop. In these embodiments, by configuring three timing elements, each generating different clock signals, and three flip-flops controlled by the different clock signals, amplitude values of three time-shifted AC input signals relative to the defined amplitude threshold can be monitored. The switching arrangement in this constellation thus allows the monitoring of AC input signals of all phases of a three-phase supply network.

The third timing element is advantageously downstream of the second timing element and is configured to be triggered by the second clock signal in order to generate the third clock signal. Thus, the second clock signal triggers the third clock signal. A combination of this embodiment with the above embodiments provides that the second output signal triggers the first clock signal, the first clock signal in turn triggers the second clock signal and the second clock signal in turn triggers the third clock signal. In this way, the first, the second and the third clock signals are triggered as a function of the second output signal, which in turn is obtained from the reference signal. Thus, the reference signal serves as a reference for the generation of the first, second and third clock signals.

In various embodiments of the switching arrangement, the flip-flops and/or the timing elements are implemented by software within a microcontroller. In this way, a very simple implementation of the switching arrangement or of parts of the switching arrangement in software is possible.

In various embodiments, the switching arrangement further comprises an OR gate for generating a total status signal, at least from the first status signal and the second status signal. The total status signal can be used as a (digital) input signal for a further control of an electronic device in which the switching arrangement is used. In embodiments having a third timing element and a third flip-flop for generating a third status signal of the type discussed above, the OR gate may be configured to generate a total status signal from the first, second, and third status signals.

In an embodiment, the present invention provides a method for monitoring AC signals.

This method comprises the following method steps:

a) Detecting an AC signal to be monitored, b) Checking whether an amplitude value of the detected AC signal or a signal obtained therefrom is above or below a defined amplitude threshold value and, as a function thereof, generating a first output signal, c) Monitoring the zero crossings of an AC reference signal or a signal obtained therefrom and generating a second output signal as a function thereof, d1) Generating a first clock signal as a function of the second output signal, and d2) Generating a second clock signal as a function of the second output signal or as a function of the first clock signal, wherein the first clock signal differs from the second clock signal at least through the time of a defined status change, and f) Generating a first status signal or a second status signal by evaluating the first output signal at the time of the status change of the first clock signal or at the time of the status change of the second clock signal.

Such a method thus makes it possible in a simple manner to monitor the amplitude values of different AC input signals which are phase-shifted relative to one another, i.e. can originate from different phases of a supply network, with regard to the defined amplitude threshold value. For example, a first AC input signal, which is at the same frequency as and in phase with the reference signal, can be monitored and a second AC input signal, which is phase-shifted with respect to the first AC input signal and the reference signal, respectively, can be monitored. By evaluating the first output signal at different points in time of defined status changes of the first and second clock signals, it is possible to decide whether the amplitude value is above or below the defined amplitude threshold value for different AC input signals phase-shifted relative to one another. Any pre-processing of the detected AC signal or of the AC reference signal may be performed using the measures and means illustrated in connection with the switching arrangement discussed above.

In a further development, the method comprises:

Generating a third clock signal as a function of the second output signal or as a function of the second clock signal. The third clock signal thereby differs from the first and from the second clock signal at least through the time of a defined status change.

Generating a third status signal by evaluating the first output signal at the time of the status change of the third clock signal.

In various implementations of the method, the first clock signal is generated by a first timer triggered by the second output signal to generate the first clock signal, and the second clock signal is generated by a second timer triggered by the first clock signal to generate the second clock signal. In this way, the first and the second clock signal are triggered as a function of the second output signal, which in turn is obtained from the reference signal. Thus, the reference signal serves as a reference for the generation of the first and second clock signals.

In various implementations of the method, the first timer and the second timer are realized in a software-controlled or software-implemented manner within a microcontroller. In these implementations, the following method steps may be performed:

Generating a first interrupt in the microcontroller by the second output signal, Starting a first timer of the microcontroller upon the occurrence of the first interrupt to realize the first timing element, Generating a second interrupt in the microcontroller upon expiration of the first timer, Starting the first timer or a second timer of the microcontroller upon the occurrence of the second interrupt to realize the second timing element, Reading and storing as the first status signal the value of the first output signal present when the second interrupt occurs, Generating a third interrupt in the microcontroller upon expiration of the first and of the second timer, respectively, Reading and storing as a second status signal the value of the first output signal present when the third interrupt occurs. Such measures allow particularly simple and rapid processing of the detected AC input signals into the corresponding status signals for further (logical) processing within an electronic device in which the method is implemented.

In a further development, the method comprises: Starting the first or the second timer or a third timer of the microcontroller upon the occurrence of the third interrupt, and generating a fourth interrupt in the microcontroller upon expiration of the started timer.

In a further development, the value of the first output signal present when the fourth interrupt occurs is read and stored as a third status signal.

In one embodiment, the first timer is started for the second time upon the occurrence of the second interrupt. The third interrupt is generated in the microcontroller upon expiration of the first timer. During the first start and the second start of the first timer, preferably different delays are set. Advantageously, the microcontroller thus uses the same timer which is programmed each time with the corresponding delay value. In a further development, in order to implement the third timing element when the third interrupt occurs, the first timer can be started for the third time, wherein the fourth interrupt is then generated when the first timer expires. The same delay is preferably set during the second start and the third start of the first timer. Thus, the interrupts are concatenated.

In an alternative embodiment, the microcontroller has the first and the second timer. When the second interrupt occurs, the second timer is started. The third interrupt is generated in the microcontroller upon expiration of the second timer. The first and second timers have different delays. In a further development, in order to implement the third timing element when the third interrupt occurs, the first timer can be started for the second time or the second timer for the second time or a third timer of the microcontroller for the first time. Upon expiration of the corresponding timer, the fourth interrupt is generated.

In an alternative embodiment, the microcontroller has the first and the second timer. The following method steps are carried out:

Generating a first interrupt in the microcontroller by the second output signal, Starting the first and the second timer upon the occurrence of the first interrupt, Generating a second interrupt in the microcontroller upon expiration of the first timer, Reading and storing as the first status signal the value of the first output signal present when the second interrupt occurs, Generating a third interrupt in the microcontroller upon expiration of the second timer, Reading and storing as a second status signal the value of the first output signal present when the third interrupt occurs.

Here, the delay of the second timer is greater than the delay of the first timer. In a further development, the microcontroller can comprise a third timer, which is started when the first interrupt occurs, wherein the fourth interrupt is generated when the third timer expires. The three timers are thus realized separately. The three timers start simultaneously, operate in parallel and end one after the other.

In various implementations of the method, the time of the status change of the first clock signal correlates with the time of a peak of a first, defined AC signal, wherein the time of the status change of the second clock signal correlates with the time of a peak of a second, defined AC signal, which is phase-shifted with respect to the first AC signal. In this way, it is possible to detect amplitude values of different AC input signals, which are phase-shifted relative to one another, in the respective peak of the AC input signals. This means that a very precise detection of amplitude values and a decision are ensured as to whether the corresponding amplitude value is above or below the defined amplitude threshold value.

For example, the AC reference signal and the first, defined AC signal are at the same frequency as and in phase with one another, wherein the time of the status change of the first clock signal is one quarter of the period after a zero crossing of the reference signal and the time of the status change of the second clock signal is one third of the period after the time of the status change of the first clock signal. In this way, AC input signals of two phases can be distinguished which are phase-shifted by one third of their period.

In various implementations of the method, the further following method step is carried out:

d3) Generating a third clock signal as a function of the second output signal or as a function of the first clock signal or as a function of the second clock signal, wherein the third clock signal differs from the first clock signal and from the second clock signal at least through the time of a defined status change, wherein in the above step f) a third status signal is generated by evaluating the first signal at the time of the status change of the third clock signal. In these implementations of the method, amplitude values of three time-shifted AC input signals relative to the defined amplitude threshold may be monitored. Thus, in this constellation, the method allows the monitoring of AC input signals of all phases of a three-phase supply network.

The third clock signal is advantageously generated by a third timing element which is triggered by the second clock signal in order to generate the third clock signal. The time of the status change of the third clock signal may correlate with the time of a peak of a third AC signal, which is phase-shifted with respect to the first AC signal and to the second AC signal.

For example, in the case where the AC-shaped reference signal and the first AC-shaped signal are of the same frequency and in phase, the time of the status change of the third clock signal is one third of the period duration after the time of the status change of the second clock signal.

The method may be implemented partially or completely in software which is configured to be executed within a microcontroller and which performs a corresponding method in its execution. The microcontroller detects the first and the second output signals in real time. The software is executed in real time.

In one embodiment, the switching arrangement and method are designed to monitor the AC signal with respect to the defined amplitude threshold value, wherein the AC signal and the reference signal may be tapped and/or derived from different phases or may be tapped and/or derived from the same phase.

In one embodiment, the switching arrangement and the method are designed to monitor AC signals tapped and/or derived from different phases with respect to the defined amplitude threshold value.

All aspects, measures and features of a switching arrangement explained above may be reflected in aspects, measures, and features of a method explained above, and vice versa.

The switching arrangement or the method of the type explained above is advantageously used in an electronic device, in particular in programmable logic controllers, logic relays or similar devices.

The invention is described in more detail below with reference to a plurality of figures.

In FIG. 1A, in principle, a switching arrangement is shown that makes it possible to process an AC input signal originating from any phase of a supply network. A second output signal or zero crossing signal S2 is generated from the supply voltage of the device by a zero crossing detector 10. In principle, from which phase this occurs is of no consequence. The three phases are denoted as La, Lb and Lc in FIG. 1A, wherein this may be any order L1, L2, L3 or L2, L3, L1 or L3, L1, L2. N is the neutral conductor. The zero crossing detector 10 is structured in FIG. 1A in the form of a comparator which compares the supply voltage with a ground potential GND (zero reference) or an approximate ground potential. In this way, zero crossings of the supply voltage can be detected. By way of example, the zero crossing detector 10 in FIG. 1A is connected to the phase La. The supply voltage at the phase La is first rectified before it is fed into the zero crossing detector 10. This is illustrated schematically in FIG. 1A in the form of a diode 3. A resistor 5 can be arranged between the diode 3 and the zero crossing detector 10. The diode 3 performs a half-wave rectification, for example, so that the zero crossing signal S2 can be generated from the signal obtained therefrom by the zero crossing detector 10. The zero crossing detector 10 is implemented as a comparator.

Figure 2:
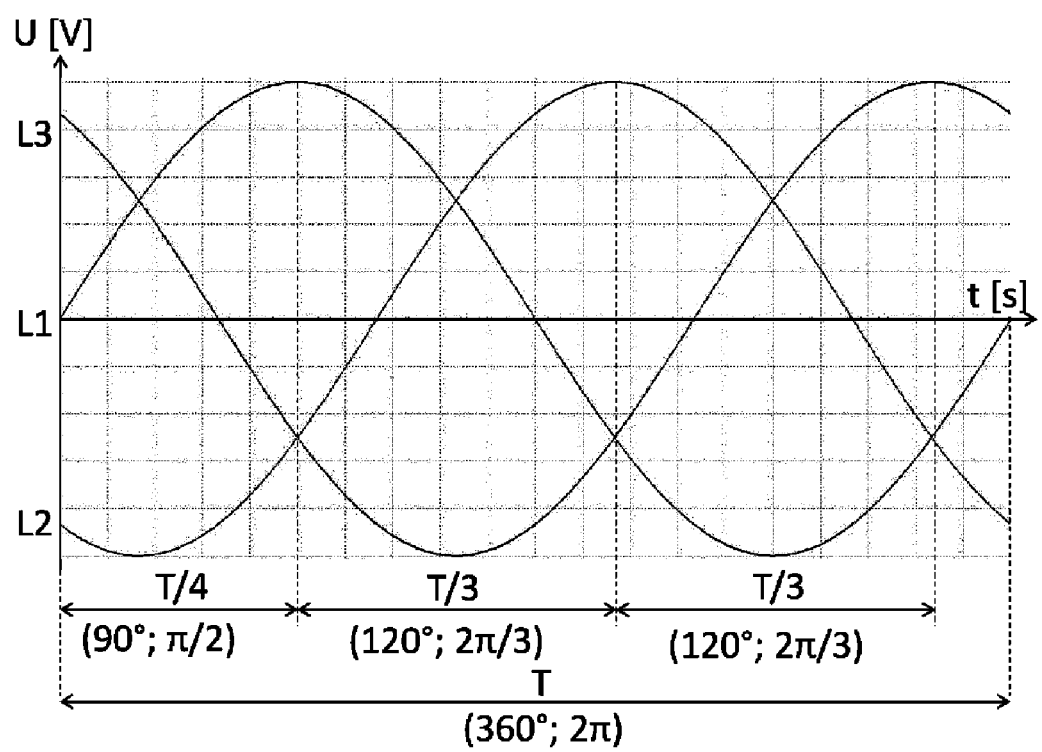
FIG. 2: three phases of an AC supply.

The processing of the AC input signals is based on the composition of the three-phase supply as shown in FIG. 2. In FIG. 2, voltages U are represented as a function of time t. These are three sinusoidal voltages, each of which is phase shifted by one third of the period T or 120° or $2\pi/3$:

$$L1: u_1(t) = U_{1max} \cdot \sin(\omega t)$$

$$L2: u_2(t) = U_{2max} \cdot \sin\left(\omega t + 2\frac{\pi}{3}\right)$$

$$L3: u_3(t) = U_{3max} \cdot \sin\left(\omega t + 4\frac{\pi}{3}\right)$$

Optionally, amplitudes $U_{1max}$, $U_{2max}$, $U_{3max}$ have the same value. In principle, an AC input signal in the peak, for example in the positive peak, should be measured in order to determine its amplitude correctly. Proceeding from L1 as shown in FIG. 2, L1 reaches this peak after T/4 or 90° or $\pi/2$, respectively. The positive peak of L2 follows after a third period T/3 or 120° or $2\pi/3$, respectively. After another third period T/3 or 120° or $2\pi/3$, the positive peak of L3 follows.

Back to FIG. 1A, the AC input signals—an AC input signal I_k is shown representatively—are rectified (by a rectifier) divided (by a step-down converter 6, here in the form of a simple voltage divider with two resistors R1, R2) and compared with a predefined amplitude threshold value A (by a comparator 8) and thus "digitized" as first output signal S1. The AC input signal I_k is a voltage signal. The rectifier has a diode 4 which can be implemented discretely.

A reference voltage source not shown in FIG. 1A gives the amplitude threshold value A. For example, the amplitude threshold A may be constant. The first output signal S1 is fed to the data inputs D of three flip-flops 14a, 14b, 14c. The clock inputs Clk are controlled by different signals. These are generated as follows (cf. FIG. 1A with FIGS. 3 to 5).

Starting from the zero crossing signal S2, the first timing element Tv1, 12a generates the first clock signal S3a as a pulse for the flip-flop 14a. The first clock signal S3a has a defined status change (falling clock edge) occurring after a delay of T/4 (90° or π/2). This corresponds to the positive peak of the "supply phase", here La (e.g. L1). The first clock signal S3a triggers the second timing element Tv2, 12b. This generates the second clock signal S3b as a pulse for the flip-flop 14b. The second clock signal S3b has a defined status change (falling clock edge) occurring after a further delay of T/3 (120° or 2π/3). This corresponds to the positive peak of the subsequent phase, here Lb (e. g. L2). The second clock signal S3b triggers the third timing element Tv3, 12c. This generates the third clock signal S3c as a pulse for the flip-flop 14c. The third clock signal S3c has a defined status change (falling clock edge) occurring after a further delay of T/3 (120° or 2π/3). This corresponds to the positive peak of the next, third phase, here Lc (e.g. L3).

In this way, the edge-triggered flip-flops 14a, 14b, 14c are driven by the corresponding clock signals S3a, S3b and S3c at their clock inputs Clk, wherein the value of the first output signal S1 at the data inputs D of the flip-flops 14a, 14b, 14c is adopted at the respective time of a corresponding status change (falling clock edge) and thus the three status signals S4a, S4b and S4c are generated at the respective outputs of flip-flops 14a, 14b, 14c. Alternatively, if clock signals S3a, S3b, S3c and flip-flops 14a, 14b, 14c are appropriately designed, a rising clock edge can also be used instead of a falling clock edge. At the outputs of the flip-flops 14a, 14b, 14c, the status signals S4a, S4b and S4c are supplied to an OR gate 15 having three inputs or to a unit which realizes an OR function in hardware or software at whose output the final digital input signal S4 is generated as a total status signal. Said total status signal S4 can be fed, for example, to further logic processing within an electronic device in which the switching arrangement is used. Such an electronic device is, for example, a programmable logic controller, a logic relay or similar device.

If the AC input signal I_k is zero (switch 17 open), the first output signal S1 of the comparator 8 is always "0" and the value "0" is stored in all three flip-flops 14a, 14b, 14c at any time. Thus, S4="0" at the output of the OR gate 15 as well. On the other hand, if a valid signal is present that exceeds the comparative threshold (amplitude threshold A) of the comparator 8, a pulse is generated at the first output signal S1 which is centered around the peak of the phase La, Lb or Lc used and whose width depends on the actual amplitude of the AC input signal I_k, i.e. the higher the amplitude, the wider the pulse of the first output signal S1. Since clock signals S3a, S3b, S3c correspond in terms of time to the positive peaks of the three phases, the positive pulse is stored at the first output signal S1 in one of the three flip-flops corresponding to the flip-flops 14a, 14b or 14c when the AC input signal I_k is generated from La, Lb, or Lc. Thus, one of status signals S4a, S4b or S4c="1", the other two remain "0". Through the OR gate 15, the total status signal S4 then="1", no matter which of the three inputs has the value "1".

Figure 1B:
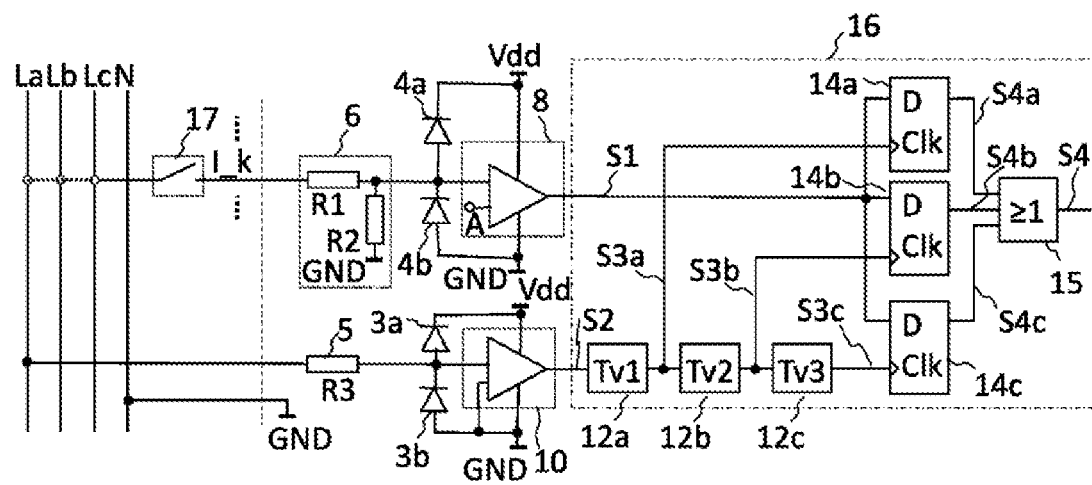

FIG. 1B shows an alternative embodiment of the switching arrangement which is a further development of the embodiment shown in FIG. 1A. In contrast to FIG. 1A, in FIG. 1B the AC input signal I_k is first fed to the step-down converter 6. The output signal of the step-down converter 6 is rectified by a first and a second diode 4a, 4b. The first diode 4a connects the input of the comparator 8 to a supply voltage terminal. A supply voltage Vdd is applied to the supply voltage terminal. The first diode 4a is poled such that a voltage at the input of the comparator 8 is smaller than the supply voltage Vdd (plus a threshold voltage of the first diode 4a). The second diode 4b connects the input of the comparator 8 to a ground potential terminal, to which ground potential GND is applied. The second diode 4b is poled such that the voltage at the input of the comparator 8 is greater than the ground potential GND (minus a threshold voltage of the second diode 4b).

The comparator 8 can be realized as a bipolar comparator. The comparator 8 generates the first output signal S1 as a function of a comparison of the voltage at the input of the comparator 8 and the amplitude threshold value A. The first output signal S1 is pulsed. The pulse of the first output signal S1 is recorded in terms of time by the microcontroller 16.

Alternatively, the comparator 8 may be implemented as an inverter. The diodes 4a, 4b can be integrated, for example, in the inverter. The diodes 4a, 4b can be realized as protective diodes. The inverter has a "built-in" amplitude threshold A. The first and the second diode 4a, 4b may optionally be integrated together with the inverter on a semiconductor body (e.g. an HC04-type CMOS inverter; CMOS is the abbreviation for complementary metal-oxide semiconductor).

To generate the second output signal S2, the voltage of one phase is first supplied to the resistor 5 and then rectified by a first and a second diode 3a, 3b. The first diode 3a connects the input of the zero crossing detector 10 to the supply voltage terminal. The first diode 3a is poled such that a voltage at the input of the zero crossing detector 10 is smaller than the supply voltage Vdd (plus a threshold voltage of the first diode 3a). The second diode 3b connects the input of the zero crossing detector 10 to the ground potential terminal. The second diode 3b is poled such that the voltage at the input of the zero crossing detector 10 is greater than the ground potential GND (minus a threshold voltage of the second diode 3b). The second output signal S2 is pulsed.

The zero crossing detector 10 can be realized as a bipolar comparator.

Alternatively, the zero crossing detector 10 may be implemented as an inverter. Diodes 3a, 3b can be integrated, for example, in the inverter. Diodes 3a, 3b can be realized as protective diodes. The inverter has the "built-in" amplitude threshold A. Since the voltage supplied to the zero crossing detector 10 is not divided, the voltage rise is rapid. Thus, the time offset between the zero crossing of the phase voltage and the switching of the zero crossing detector 10 is very small and can be ignored.

The threshold of the zero crossing detector 10 may be 0 V (i.e., the ground potential) or a voltage differing from 0 V, e.g., a small positive voltage (e.g., 2 V).

In alternative embodiments, the comparator 8 and/or the zero crossing detector 10 may be implemented as a CMOS gate, such as an HC-type CMOS gate, or as a transistor. In the case of the transistor, the amplitude threshold value A may be, for example, the base-emitter voltage as of which a current flows through the transistor (e.g. Ube=approx. 0.65 V). The resistance values of the resistors R1, R2 of the step-down converter 6 are then dimensioned accordingly.

Only the second diodes 4b and 3b may then be provided for. The first diodes 4a and 3a, respectively, may be dispensed with.

The comparator 8 can be produced as a gate to which the diodes 4a, 4b are externally connected upstream as protective diodes or as a gate with integrated diodes 4a, 4b (such as a CMOS inverter with protective diodes, such as HC04).

The zero crossing detector 10 can be produced as a gate to which the diodes 3a, 3b are externally connected upstream as protective diodes or as a gate with integrated diodes 3a, 3b (such as a CMOS inverter with protective diodes, such as HC04). The protective diodes can be protective diodes against electrostatic charging, abbreviated to ESD protective diodes.

The preprocessing (rectifying, stepping down) is illustrated by way of example in FIGS. 1A and 1B and can also be realized with alternative circuits. Rectifying can optionally be dispensed with. The preprocessing is designed to protect the comparator 8 and/or the zero crossing detector 10 against overvoltages (input>positive supply+tolerance) and undervoltages (input<negative supply, possibly ground potential GND tolerance). This function can optionally also adopt a rectifier diode 3b, 4b for (negative) undervoltages; optionally, additional protection against overvoltage can be provided for.

Figure 3:
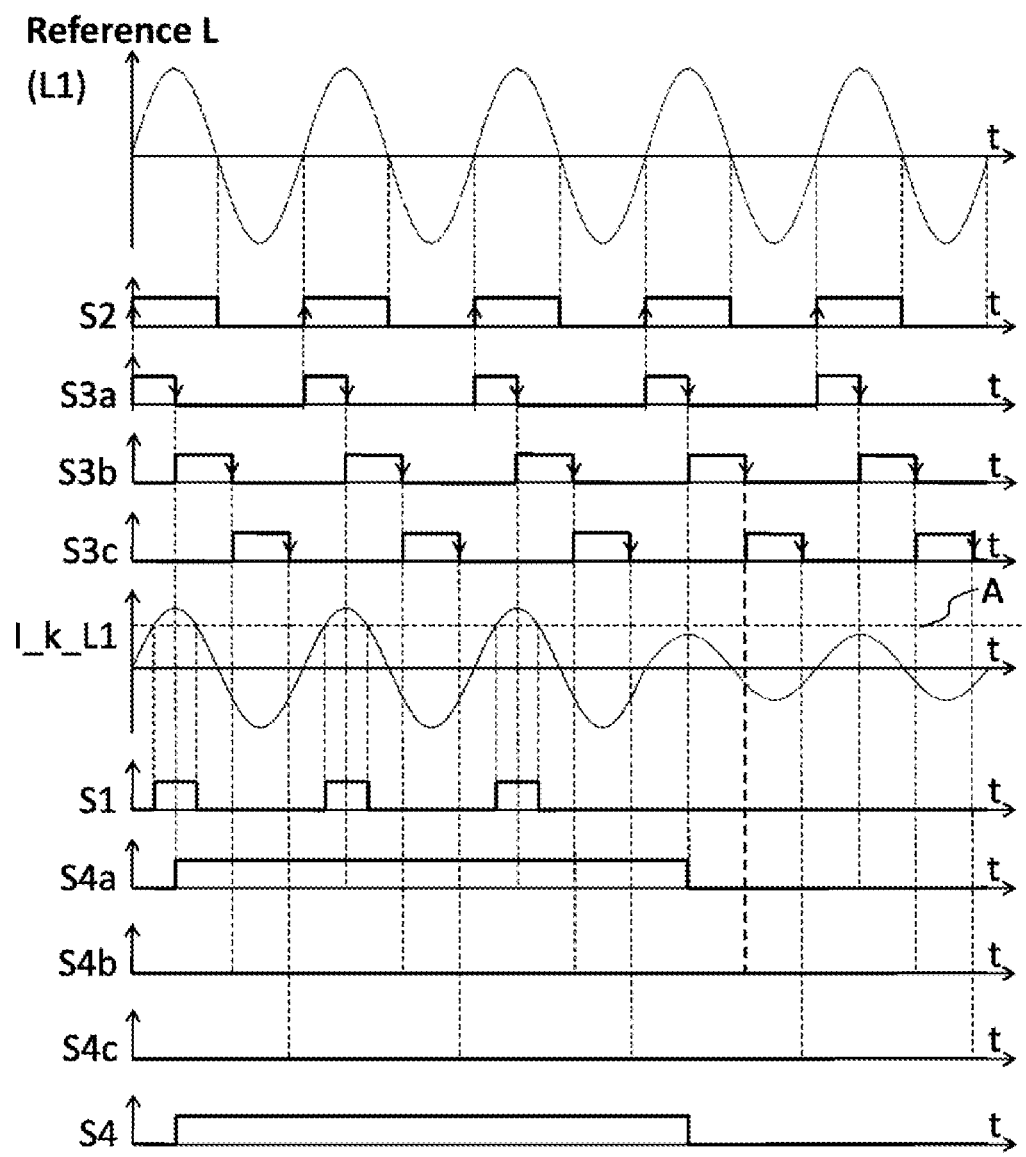
FIG. 3: a processing of an input signal derived from a first phase.

FIG. 3 illustrates, by way of example, the time profile of all signals when the reference phase is L1 and the AC input signal I_k is also derived from L1 (I_k_L1). Input I_k_L1 is represented by means of signal S1 as "1" (the amplitude exceeds amplitude threshold A) for three periods and for a further two periods as "0" (the amplitude is less than amplitude threshold A). In this case, signal S4a from signal S1—controlled by the falling clock edge of clock signal S3a—is correspondingly adopted as "1" or "0", S4b and S4c remain "0". At the output, S4 corresponds to signal S4a and, with the corresponding delay (T/4), reproduces the status of input I_k_L1.

Figure 4:
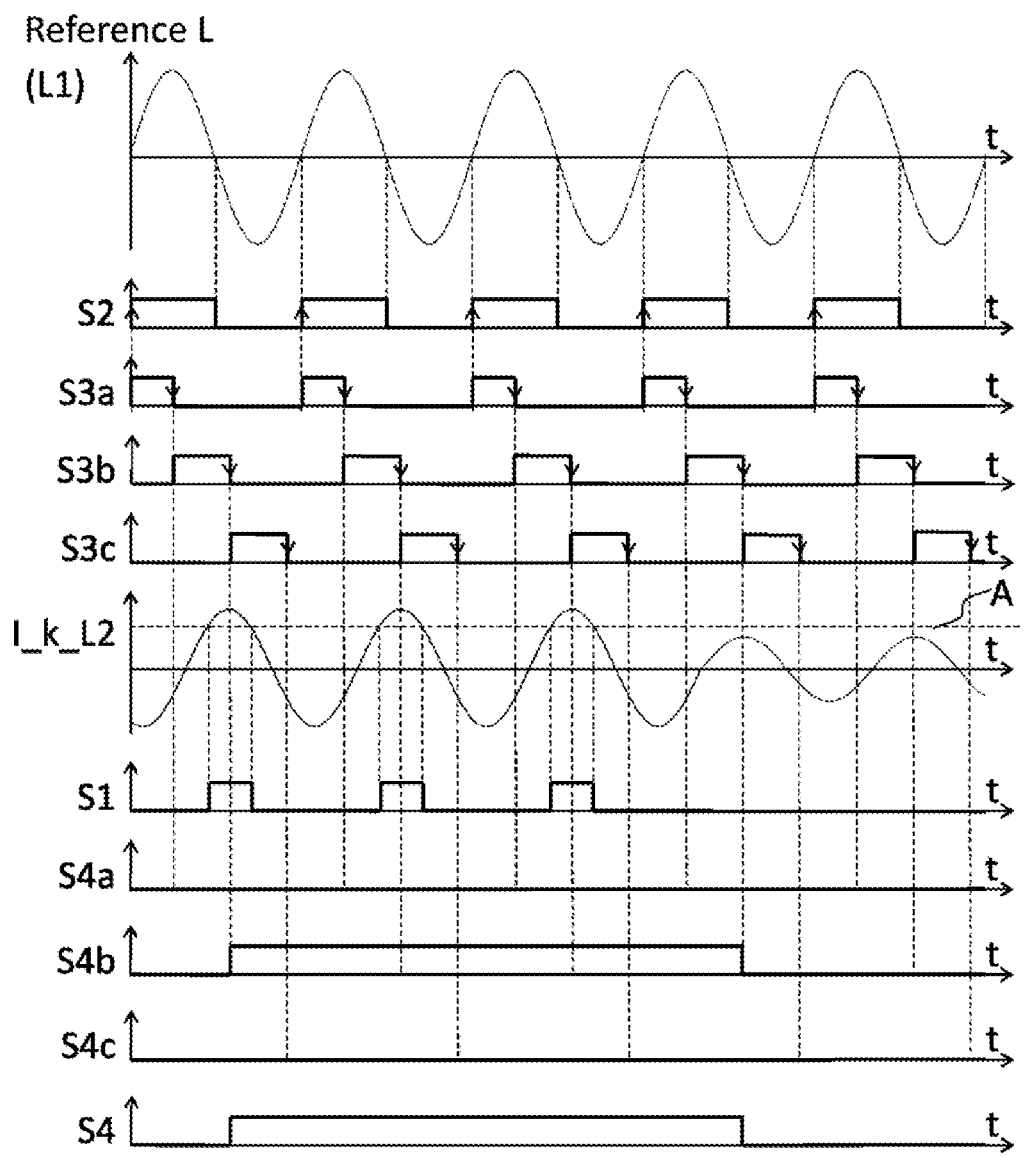
FIG. 4: a processing of an input signal derived from a second phase.

FIG. 4 illustrates the time profile of all signals when the AC input signal I_k is derived from L2 (I_k_L2). Input I_k_L2 is represented by means of signal S1 as "1" (amplitude exceeds amplitude threshold A) for three periods and for a further two periods as "0" (amplitude is less than amplitude threshold A). In this case, signal S4b from signal S1 controlled by the falling clock edge of clock signal S3b is correspondingly adopted as "1" or "0", S4a and S4c remain "0". At the output, S4 corresponds to signal S4b and, with the corresponding delay (T/4+T/3=7T/12), reproduces the status of input I_k_L2.

Figure 5:
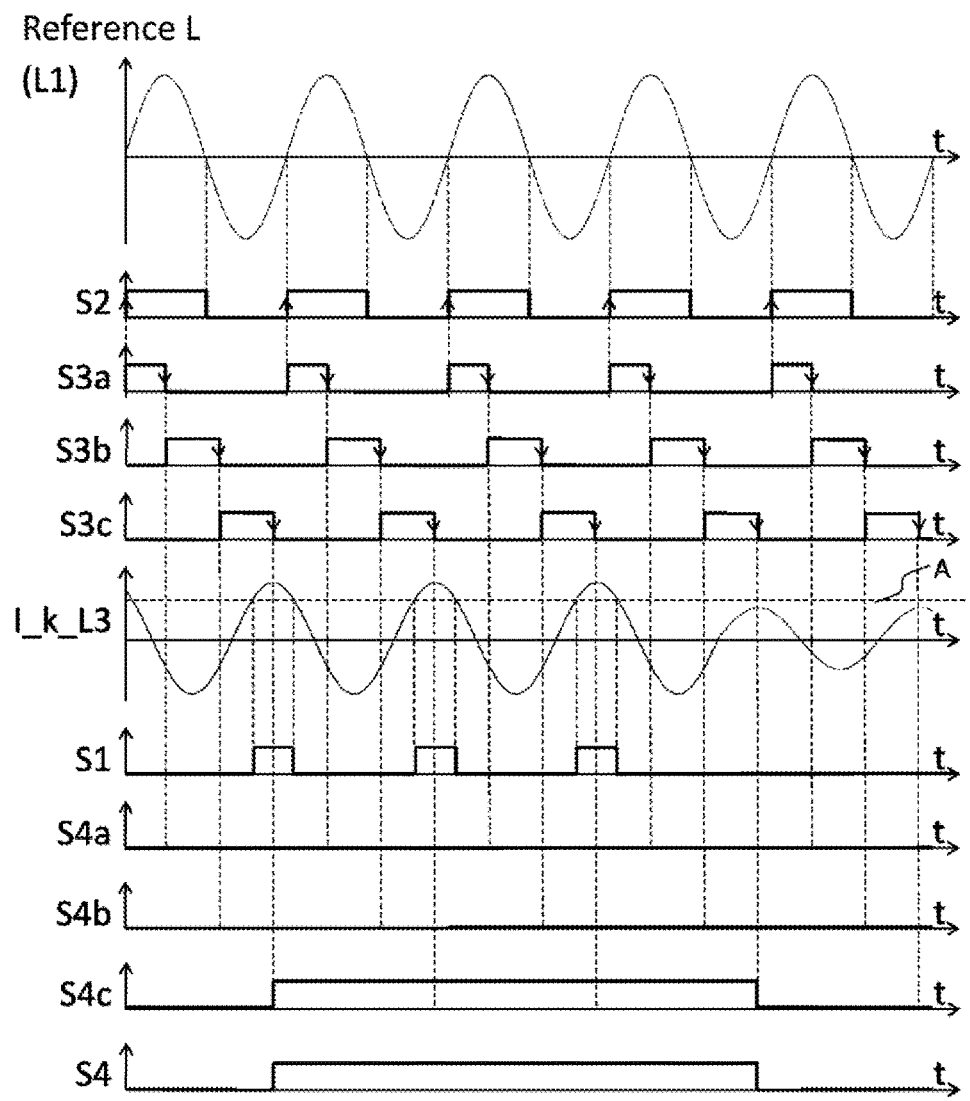
FIG. 5: a processing of an input signal derived from a third phase.

FIG. 5 illustrates the time profile of all signals when the AC input signal I_k is derived from L3 (I_k_L3). Input I_k_L3 is represented by means of signal S1 as "1" (amplitude exceeds amplitude threshold A) for three periods and for a further two periods as "0" (amplitude is less than amplitude threshold A). In this case, signal S4c from signal S1—controlled by the falling clock edge of clock signal S3c—is correspondingly adopted as "1" or "0"; S4a and S4b remain "0". At the output, S4 corresponds to signal S4c and, with the corresponding delay (T/4+2T/3=11T/12), reproduces the status of input I_k_L3.

It can be seen that the method enables the detection of the corresponding input signals I_k_L1, I_k_L2, 1_k_L3 within a period T, i.e., for example, at 50 Hz after 20 ms at the latest.

Preferably some or all of the elements marked in the right-hand box in FIGS. 1A and 1B (timing elements 12a, 12b, 12c, flip-flops 14a, 14b 14c, OR gate 15) are implemented in a microcontroller 16. Input signals S1 (one or a plurality) are connected as normal inputs. The zero crossing signal S2 is connected at an interrupt input. The OR gate 15 may be implemented as an OR function in software by the microcontroller 16.

FIG. 6 shows in principle how the processing can take place in software. Below, a plurality of AC input signals I_K to be monitored is assumed. In an interrupt routine of the microcontroller 16, triggered by an interrupt (referred to here as interruption) of the second output signal S2, a first timer for realizing the first timing element 12a with the value T/4 is started, which generates a further interrupt at the end (after its expiration). At this time, the first output signals S1 are read and the first status signals S4a are correspondingly stored in the memory. At the same time, the first timer for realizing the second timing element 12b having the value T/3 is restarted. After the time has expired, a further interrupt is generated, the first output signals S1 are read again and the second status signals S4b are stored in the memory.

At the same time, the first timer for realizing the third timing element 12c is restarted with T/3. After the time has elapsed, a further interrupt is generated, the first output signals S1 are read again and the third status signals S4c are stored in the memory. All cached values of the status signals S4a, S4b and S4c become OR linked. As a result, the digitized input values S4 are now obtained. The first timer thus realizes the first, second and third timing elements 12a, 12b, 12c. A timer may also be referred to as a time emitter. The interrupt may also be referred to as interruption.

In order to determine the period T, when the microcontroller 16 or the device is switched on and initialized, the zero crossing signal S2 is measured in terms of time. The time intervals between two successive pulses are measured by means of a timer. As a rule, this distinguishes between 50 Hz and 60 Hz, but other frequencies can also be supported. The timer values are then calculated:

At 50 Hz: T=20 ms, T/4=5 ms, T/3=6.666 ms
At 60 Hz: T=16.666 ms, T/4=4.166 ms, T/3=5.555 ms.

Alternatively, the first, second and third timing elements 12a, 12b, 12c may be realized by a first, a second and a third timer or time emitter, which are started in a concatenated manner. The delay values are also T/4, T/3 and T/3.

In an alternative embodiment, the first, second and third timing elements 12a, 12b, 12c can be realized by a first, a second and a third timer or time emitter, which are started in parallel after the interruption by the second output signal S2. The delay value of the first timer is then T/4, of the second timer T·7/12 and of the third timer T·11/12.

The illustrated embodiments are merely exemplary. In alternative embodiments, which are indicated in FIGS. 1A and 1B by means of dots, at least one further AC input signal I_k' can be supplied to the switching arrangement. The further AC input signal I_k' can also be tapped at one of the phases La, Lb or LC. The switching arrangement can, therefore, comprise at least one further comparator and three further downstream flip-flops. The signals of the zero crossing detector 10 and the timing elements 12a, 12b, 12c are suitable for monitoring whether the amplitude of the further AC input signal I_k' is above the amplitude threshold A. A number of n AC input signals, which can be tapped arbitrarily at one of the three different phases L1, L2 or L3, is fed to the switching arrangement and detected. In this case, n may be 1 or 2 or more than 2.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 3, 3a, 3b Diode
4, 4a, 4b Diode
5 Resistor
6 Step-down converter
8 Comparator
10 Zero crossing detector
12a, 12b, 12c Timing element
14a, 14b, 14c Flip-flop
15 OR gate
16 Microcontroller
17 Switch
A Threshold amplitude value
D Data input of a flip-flop
Clk Clock input of a flip-flop
I_k, I_k_L1 AC input signal
I_k_L2, 1_k_L3 AC input signal
GND Ground potential
La, Lb, Lc Phases
L1, L2, L3 Phases
N Neutral conductor
S1 First output signal
S2 Second output signal
S3a, S3b, S3c Clock signals
S4a, S4b, S4c Status signals
S4 Total status signal
U Voltage
Vdd Supply voltage
T Period
t Time

The invention claimed is:

1. A switching arrangement for monitoring AC signals, comprising:
one or a plurality of comparators, to which an AC signal to be monitored or a signal obtained therefrom is feedable in each case at a first comparison input, for comparison with a defined amplitude threshold value present at a second comparison input, so as to generate a first output signal at an output;
a zero crossing detector, to which a reference signal or a signal obtained therefrom is feedable at a monitoring input, so as to generate a second output signal at an output of the zero crossing detector;
a first timing element downstream of the zero crossing detector configured to generate a first clock signal as a function of the second output signal;
a second timing element downstream of the zero crossing detector configured to generate a second clock signal as a function of the second output signal or as a function of the first clock signal, the second clock signal differing from the first clock signal;
a first edge-triggered flip-flop; and
a second edge-triggered flip-flop,
wherein the output of the comparator or the outputs of the comparators are connected to a level-triggered input of the first flip-flop and the second flip-flop, respectively, and
wherein an output of the first timing element is connected to an edge-triggered input of the first flip-flop and an output of the second timing element is connected to an edge-triggered input of the second flip-flop so as to generate a first status signal at an output of the first flip-flop and a second status signal at an output of the second flip-flop.

2. The switching arrangement according to claim 1, wherein the second timing element is downstream of the first timing element and configured to be triggered by the first clock signal to generate the second clock signal.

3. The switching arrangement according to claim 1, wherein flip flops and/or timing elements comprise software within a microcontroller.

4. The switching arrangement according to claim 1, further comprising an OR gate configured to generate a total status signal from the first status signal and the second status signal.

5. A method for monitoring AC signals comprising the following method steps:
detecting an AC signal to be monitored;
checking whether an amplitude value of the detected AC signal or a signal obtained therefrom is above or below a defined amplitude threshold value and, as a function thereof, generating a first output signal;
monitoring zero crossings of an AC reference signal or a signal obtained therefrom and generating a second output signal as a function thereof;
generating a first clock signal as a function of the second output signal, wherein the first clock signal is generated by a first timing element triggered by the second output signal for generating the first clock signal;
generating a second clock signal as a function of the second output signal or as a function of the first clock signal, the first clock signal differing from the second clock signal at least through a time of a defined status change, wherein the second clock signal is generated by a second timing element triggered by the first clock signal for generating the second clock signal, wherein the first timing element and the second timing element are realized in a software-controlled manner within a microcontroller;
generating a first status signal or a second status signal by evaluating the first output signal at a time of the status change of the first clock signal or at a time of the status change of the second clock signal;
generating a first interrupt in the microcontroller by the second output signal;

starting a first timer of the microcontroller for realizing the first timing element upon occurrence of the first interrupt;

generating a second interrupt in the microcontroller upon expiration of the first timer:

starting the first timer or a second timer of the microcontroller to realize the second timing element upon occurrence of the second interrupt;

reading and storing as the first status signal the value of the first output signal present when the second interrupt occurs;

generating a third interrupt in the microcontroller upon expiration of the first or the second timer; and reading and storing as the second status signal the value of the first output signal present when the third interrupt occurs.

6. The method according to claim 5, wherein the time of the status change of the first clock signal correlates with a time of a peak of a first, defined AC signal and the time of the status change of the second clock signal correlates with a time of a peak of a second, defined AC signal, which is phase-shifted with respect to the first AC signal.

7. The method according to claim 6, wherein the AC reference signal and the first, defined AC signal are at a same frequency and in phase and the time of the status change of the first clock signal is one quarter of a period after a zero crossing of the reference signal and the time of the status change of the second clock signal is one third of a period after the time of the status change of the first clock signal.

8. The method according to claim 5, further comprising:

generating a third clock signal as a function of the second output signal or as a function of the second clock signal, the third clock signal differing from the first and from the second clock signal at least through the time of a defined status change; and generating a third status signal by evaluating the first output signal at the time of the status change of the third clock signal.

9. A tangible, non-transitory computer-readable medium having instructions thereon which, upon being executed by a microcontroller, provide for execution of the method according to claim 5.

* * * * *